United States Patent [19]
Yamada et al.

[11] Patent Number: 5,610,608
[45] Date of Patent: Mar. 11, 1997

[54] METHOD OF RECORDING SIGNAL, METHOD OF REPRODUCING SIGNAL, AND METHOD OF RECORDING/REPRODUCING SIGNAL

[75] Inventors: Kunio Yamada; Yasuyuki Fukutomi, both of Tokyo, Japan

[73] Assignee: Nippon Precision Circuits Inc., Tokyo, Japan

[21] Appl. No.: 352,253

[22] Filed: Dec. 8, 1994

[30] Foreign Application Priority Data

Dec. 10, 1993 [JP] Japan ..................... 5-310698

[51] Int. Cl.$^6$ ..................................... H03M 3/00
[52] U.S. Cl. .................................. 341/143; 375/244
[58] Field of Search ..................... 341/143; 375/244–246

[56] References Cited

FOREIGN PATENT DOCUMENTS

| | | |
|---|---|---|
| 0027233 | 4/1981 | European Pat. Off. . |
| 0277067 | 8/1988 | European Pat. Off. . |
| 2125255 | 2/1984 | United Kingdom . |
| 7900462 | 7/1979 | WIPO . |
| 8502732 | 6/1985 | WIPO . |

*Primary Examiner*—Jeffrey A. Gaffin
*Assistant Examiner*—Jason L. W. Kost
*Attorney, Agent, or Firm*—Jordan and Hamburg

[57] ABSTRACT

A method of accurately recording and reproducing an analog signal having a wide dynamic range with a small amount of information first samples amplitude values of an analog waveform which are then converted to a digital signal. Plural frames of data are stored in a buffer circuit. For each frame, the differences between successive values of the digital signal are extracted to form a second digital signal having an amount of shift S common to one frame, which is established and stored in a memory. In response to the amount of shift, the second digital signal is shifted toward lower bits thereof to compress the second digital signal into a third digital signal having less bits which is stored. When the difference values are small, the amount of shift is reduced to suppress errors produced during compression. When the difference values are large dynamic range is obtained, thereby coping with great signal variations without neglecting small variations in the analog signal. During reproduction, a digital signal indicating the amount of shift S and the third digital signal are read from the memory. A fourth digital signal corresponds to the differences between successive amplitude values obtained by demodulating the third digital signal according to the amount of shift S. The fifth digital signal is accumulated. Thus, a signal corresponding to the amplitude values is obtained and converted to an analog signal.

19 Claims, 10 Drawing Sheets

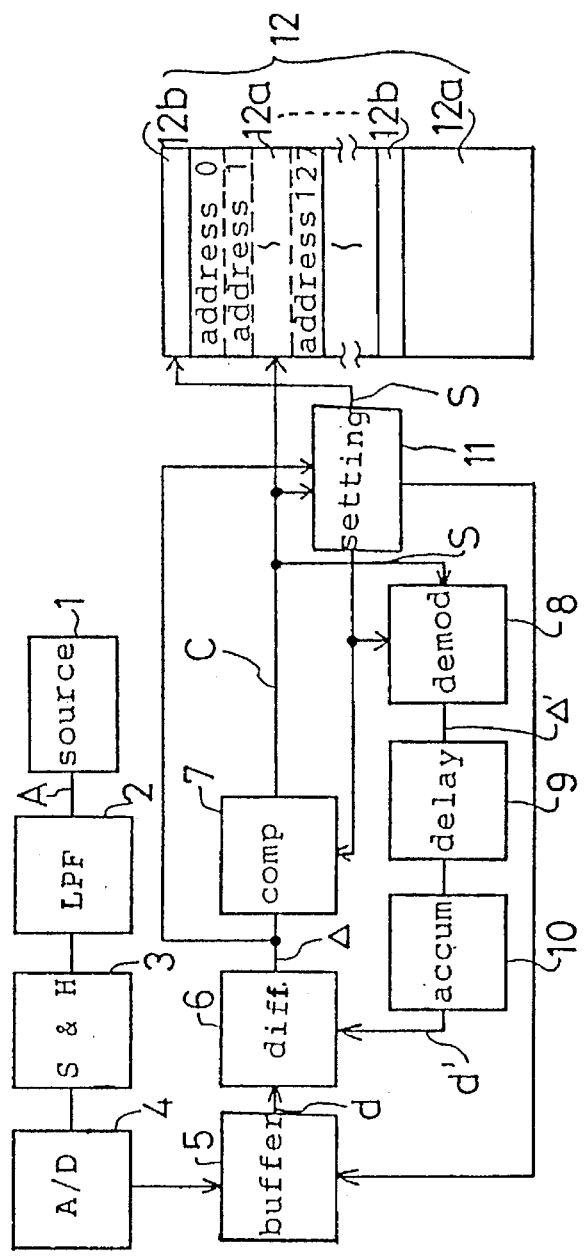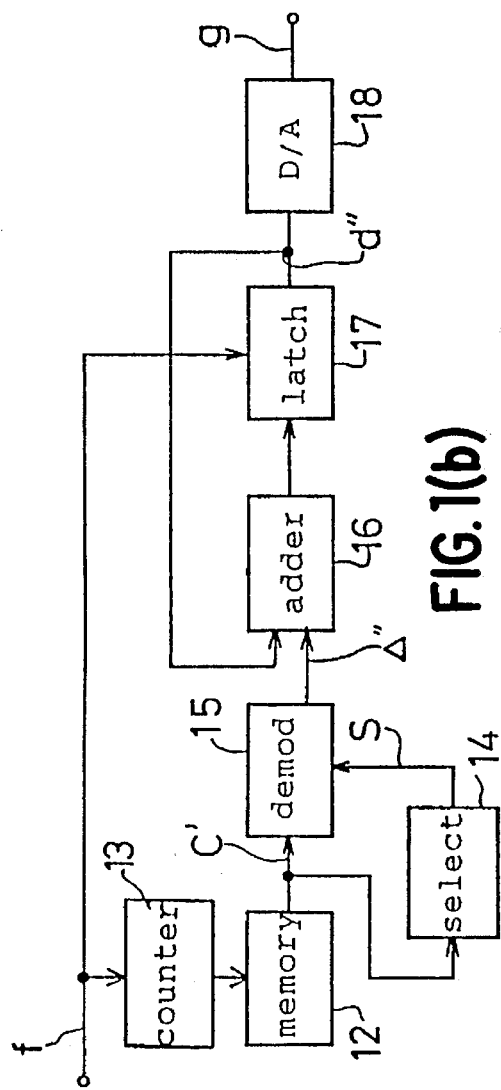

METHOD OF RECORDING SIGNAL, METHOD OF REPRODUCING SIGNAL, AND METHOD OF RECORDING/REPRODUCING SIGNAL

BACKGROUND OF THE INVENTION

The present invention relates to a method of recording and/or reproducing a signal, a method of reproducing a signal, and a method of recording/reproducing a signal.

A PCM (pulse-code modulation) acoustic synthesizer circuit is known which reads a digital signal at certain intervals of time from a ROM or the like in which the digital signal corresponding to amplitude values of an acoustic waveform such as audio speech is stored. Then, the circuit converts the digital signal into analog form and reproduces the acoustic waveform into, for example, an audio speech.

Recently, a DPCM (differential pulse-code modulation) signal recording/reproducing method has become available as a method of recording and reproducing an analog signal with a fewer number of bits than the conventional PCM method. In particular, whenever an analog signal is sampled, the difference between the presently sampled amplitude value and the previously sampled amplitude value is taken. The resulting value is stored as a digital signal in a ROM or the like. During reproduction, whenever the digital signal is read from the ROM, this digital signal is accumulated to the digital signals read out thus far. A digital signal corresponding to an amplitude value of a sample which results in the currently read digital signal is calculated. This calculated digital signal is converted into analog form. Thus, an analog waveform is obtained.

It is known that in the PCM and DPCM methods, if a signal exceeding the full-scale voltage is applied during analog-to-digital conversion, an overflow occurs, and that the recorded and reproduced waveform is distorted due to overload noise. The prior art DPCM method cannot follow rapid waveform variations because of limited quantized bit numbers. In order to avoid this situation and to record and reproduce an analog signal having a wide dynamic range, if the full-scale voltage is enlarged and the number of quantized bit numbers is increased, then the merit of the DPCM method, i.e., capable of recording and reproducing an analog signal with limited quantization bit numbers, is defeated.

Furthermore, if the number of quantization bits is increased, the amount of information per digital signal is, of course, increased. Where the waveform variations are mild, the value of the digital signal indicating a difference decreases. As a result, upper bits become vacant, i.e., assume a value of 0. For example, when the number of quantization bits is 8 bits, if the digital signal indicative of the difference value is "00010111", then the upper three bits are vacant. That is, effective use of the storage capacity of the ROM or the like cannot be made.

SUMMARY OF THE INVENTION

Accordingly, it is an object of the present invention to provide means capable of accurately recording and reproducing an analog signal having a wide dynamic range with a small amount of information.

In accordance with a first aspect of the present invention, a method of recording a signal includes the steps of sampling an analog signal at a given sampling frequency to produce a sampled signal; converting the sampled signal into digital form to create a first digital signal; storing the first digital signal in a first storage region whenever a predetermined number of samples are produced; successively reading the first digital signal from the storage region; taking a difference between an amplitude signal corresponding to an amplitude of a presently read first digital signal and an amplitude signal corresponding to an amplitude of a previously read first digital signal, to produce a second digital signal; converting the second digital signal into a third digital signal which is equal essentially to 1/K of the second digital signal; setting a value of K for each third digital signal obtained from the first digital signals stored in the first storage region, such that the values of the third digital signal lie in a predetermined range; and storing the third digital signals and data representative of the values of K.

Preferably, the step of converting the second digital signal into a third digital signal is obtained by the step of shifting the second digital signal toward lower bits thereof by S digits, wherein $K=2^S$, where S is an integer within a predetermined range, for example, 0 to 3, inclusive. The value of S is reduced when the value of the second digital signal is reduced.

The amplitude signal corresponding to the amplitude of the previously read first digital signal is obtained by shifting the third digital signal toward upper bits by S bits so as to create a fourth digital signal and accumulating a plurality of the fourth digital signals.

The step of converting the second digital signal into a third digital signal includes the step of dividing the value of the second digital signal by a factor 1/K where K is an integer to produce a divided result, and truncating the divided result to produce the third digital signal.

In accordance with another aspect of the present invention, a method of recording/reproducing a signal, includes the steps of producing a recording signal by the steps of sampling an analog signal at a given sampling frequency to produce a sampled signal, converting the sampled signal into digital form to create a first digital signal, storing the first digital signal in a first storage region whenever a predetermined number of samples are produced, successively reading the first digital signal from the storage region; taking a difference between an amplitude signal corresponding to an amplitude of a presently read first digital signal and an amplitude signal corresponding to an amplitude of a previously read first digital signal to produce a second digital signal, converting the second digital signal into a third digital signal which is equal essentially to 1/K of the second digital signal, setting a value of K for each third digital signal obtained from the first digital signals stored in the first storage region such that values of the third digital signal lie in a predetermined range, and storing the third digital signals and data representative of the values of K; and producing a reproducing signal by the steps of reading out the third digital signals and the data representative of values of the K, multiplying the third digital signal by K to convert the third digital signal into a fifth digital signal, producing an accumulated signal as an analog output signal by successively accumulating signal as an analog output signal by successively accumulating either the fourth digital signal, or an analog equivalent signal obtained by converting the fourth digital signal into an analog form.

In one embodiment, the step of multiplying includes the step of shifting the third digital signal toward upper bits thereof by S digits, wherein $K=2^S$.

In another embodiment, the step of multiplying includes the steps of converting the third digital signal to an analog signal by a digital-to-analog converter having an input supplied with a reference voltage, and modifying the reference voltage in accordance with the value K.

In still another embodiment, the step of multiplying includes the steps of converting the third digital signal to an analog signal, counting a value up to an amount of shift S, where $K=2^S$, and switching the analog signal through a switching means at a time dependent on the counted value.

In yet another embodiment, the step of multiplying includes the steps of converting the third digital signal to a pulse width modulated signal, and gating the pulse width modulated signal through gating means in accordance with the value K.

Further, the step of producing an accumulated signal preferably includes the step of integrating either the fourth digital signal, or an analog equivalent signal obtained by converting the fourth digital signal into an analog form.

In accordance with a further aspect of the present invention, a method of recording a signal, includes the steps of sampling an analog signal at a given sampling frequency to successively obtain sample data; taking a difference between the sample data and an accumulated output from an accumulator circuit; producing a code output corresponding essentially to 1/K of the difference output, where K is an integer; and accumulating outputs, which are obtained by multiplying the code output by K, to produce the accumulated output by the accumulator circuit.

The objects described above are achieved by the method of recording and/or reproducing a signal according to the present invention.

BRIEF DESCRIPTION OF THE DRAWINGS

FIG. 1(a) is a block diagram of a signal recording embodiment of the present invention;

FIG. 1(b) is a block diagram of a signal reproducing embodiment of the present invention;

DESCRIPTION OF THE PREFERRED EMBODIMENTS

Figure 2:
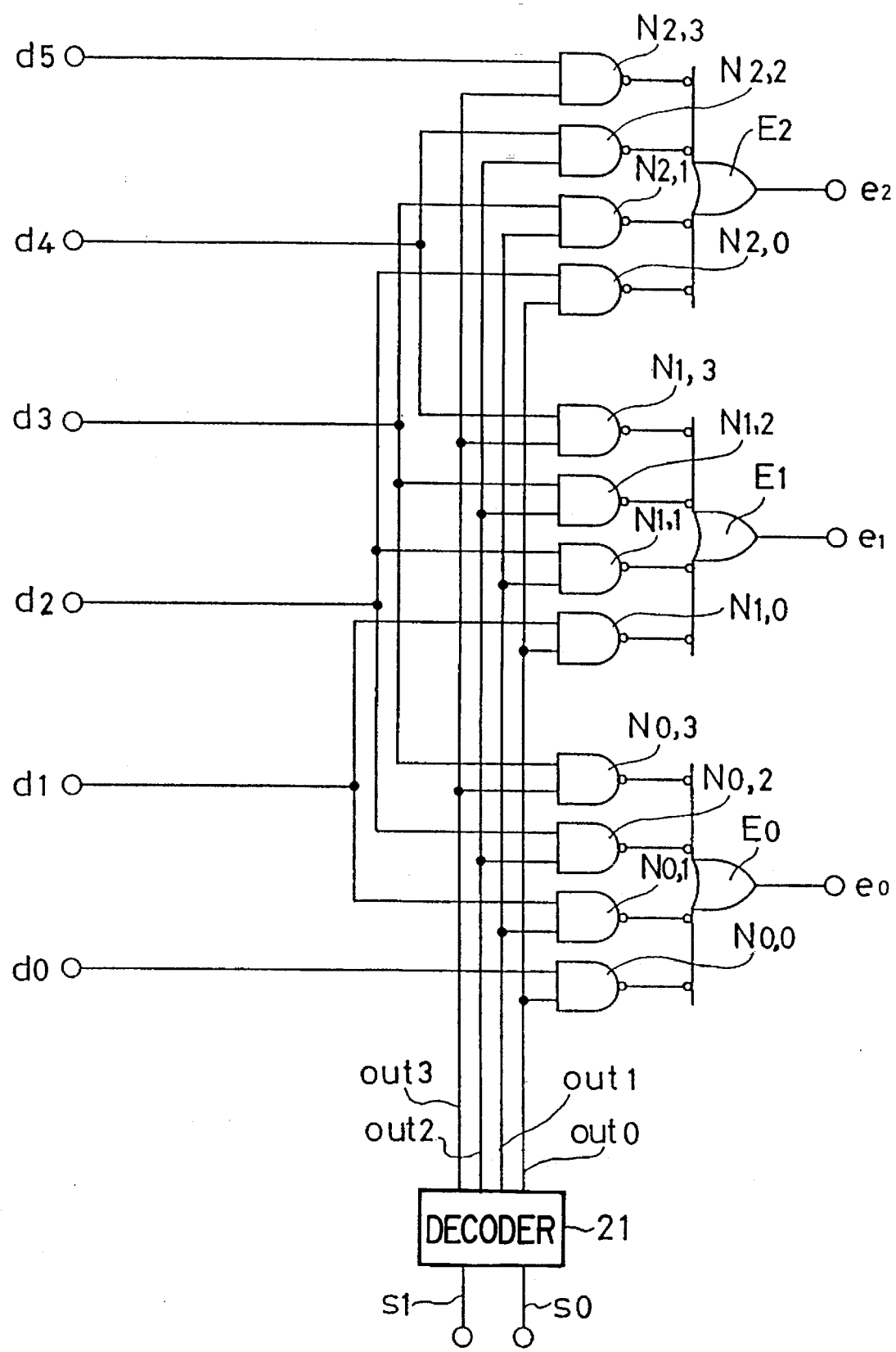
FIG. 2 is a circuit diagram showing a configuration of the embodiment shown in FIG. 1(a)

A first embodiment of the present invention will now be described relative to the block diagram of FIG. 1(a) which shows a configuration for implementing a signal-recording method of the present invention and FIG. 1(b) which shows a configuration for implementing a signal-reproducing method of the present invention. In FIG. 1(a) an analog signal source 1 for producing an analog signal is comprised of a microphone and an amplifier. An acoustic wave or signal picked up by the microphone is used as an analog signal.

A low-pass filter circuit 2 filters out those components of the analog signal sent from the analog signal source which have frequencies higher than the recordable frequency band. A sample-and-hold circuit 3 samples amplitude values of the analog signal produced from the low-pass filter circuit 2 at a certain sampling frequency and produces an output signal. An A/D converter circuit 4 converts the amplitude values sampled by the sample-and-hold circuit 3 into digital form to thereby produce a first digital signal as an output signal. In this embodiment, the first digital signal is comprised of 6 bits. However, the present invention is not limited to this scheme.

A buffer circuit 5 receives the first digital signal produced from the A/D converter circuit 4 and temporarily stores plural frames of the digital signal, each frame including a certain number of samples. In this embodiment, each frame includes 128 samples. Each frame thereby forms a certain storage region. The first digital signal stored in the buffer circuit 5 is successively read out at given intervals of time from the first frame.

A differential circuit 6 successively received the first digital signal read from the buffer circuit 5, takes the differences between amplitude value signals corresponding to the presently read first digital signal d and the previously read first digital signal, respectively, and produces the differences as a second digital signal Δ.

A signal-compressing circuit 7 receives the second digital signal Δ delivered from the differential circuit, converts the second digital signal value into a third digital signal corresponding to 1/K (K is an integer equal to or greater than 1 and specified by a setting circuit to be described later) of the second digital signal value, and produces the third digital signal as an output signal. In this embodiment, the second digital signal is shifted toward lower bits by S ($K=2^S$) bits to obtain the third digital signal C corresponding to $½^S$ of the second digital signal values. More specifically, the signal-compressing circuit 7 shifts the second digital signal toward lower bits in response to the amount of shift S produced from the setting circuit (described later). In this embodiment, S includes 2 bits (i.e., S=0–3), but the present invention is not limited to this structure. Three lower bits are delivered as the third digital signal. Let us assume that the second digital signal is "001101" and that the amount of shift is "2". In this case, "011" is produced as the third digital signal.

A signal-demodulating circuit 8 receives the third digital signal and shifts it toward upper bits by the amount of shift S. In this way, the third digital signal is demodulated into a digital signal having the same number of bits as the second digital signal. The resulting signal is produced as a fourth digital signal Δ. Assuming that the third digital signal is "011" and that the amount of shift is "2", "001100" is delivered as the fourth digital signal A delay circuit 9 receives the fourth digital signal delivered from the signal-demodulating circuit 8 and delivers the fourth digital signal with a delay equal to one period with which the digital signal is read from the buffer circuit 5.

A accumulator circuit 10 accumulates the fourth digital signal successively delivered from the delay circuit 9 after certain frames of the buffer circuit 5 are started to be read out. Thus, the aforementioned amplitude signal d' is obtained. This amplitude signal is supplied to the differential circuit 6.

The setting circuit, indicated by 11, controls writing and reading of signals to and from the buffer circuit 5. Furthermore, the setting circuit 11 receives the second and third digital signals and sets the aforementioned amount of shift S, as K, to such a value that it is common to every third digital signal obtained from the first digital signal stored in the same frame of the buffer circuit 5, and that values of the third digital signal lie in a certain range. In this embodiment, the range is represented in terms of 3 bits, i.e., from "111" to "000". This amount of shift S is supplied to the signal-compressing circuit 7, the signal-demodulating circuit 8, and shift amount storage regions in a memory 12 described hereinafter. Each individual storage region is used for each frame.

The memory 12 comprises a compressed signal storage region 12a for recording the third digital signal C whenever a new frame arrives and a shift amount storage region 12b for recording a signal indicating the amount of shift S for each frame. In the memory 12, the compressed signal storage region 12a for each frame is positioned in an address located immediately after the shift amount storage region 12b for each frame such that these two kinds of storage regions alternate with each other. The compressed signal storage region 12a for the frames has addresses numbered from 0 to 127. First, a digital signal indicating the amount of shift S for one frame is written. Then, values of the third digital signal C for the same frame are successively written.

Referring to FIG. 1(b) an address counter circuit 13 receives certain synchronizing pulses F, e.g., pulses having the same frequency as the sampling frequency, and reads the amounts of shift S and the third digital signal C stored in the memory 12 successively. Memory 12 preferably is comprised of a ROM in which the same digital signal as stored in the memory indicated by the same reference number 12 in FIG. 1(a) is stored.

A selecting circuit 14 selects digital signals indicating the amount of shift S from the signals successively read from the memory 12, and produces the selected signals as an output signal.

A signal-demodulating circuit 15 is similar in structure to the signal-demodulating circuit 8. This circuit 15 demodulates the third digital signal read from the memory 12 in response to the digital signal indicative of the amount of shift S that is produced form the selecting circuit 14. The demodulated signal is delivered as a fifth digital signal Δ" corresponding to the differences between sampled amplitude values.

An adder circuit 16 adds the fifth digital signal produced form the signal-demodulating circuit 15 to the contents of a latch circuit (described below) and supplies the sum to the latch circuit. The latch circuit, indicated by 17, latches the output from the adder circuit 16 whenever it receives the synchronizing pulse f, and delivers the latched signal as an output signal. The latch circuit 17 delivers a digital signal d" having a value obtained by accumulating the fifth digital signal corresponding to the differences between the sampled amplitude values. This digital signal corresponds to the amplitude values.

A D/A converter circuit 18 converts the digital signal corresponding to amplitude values produces from the latch circuit 17 into analog form, thus reproducing the analog signal waveform.

Figure 3:
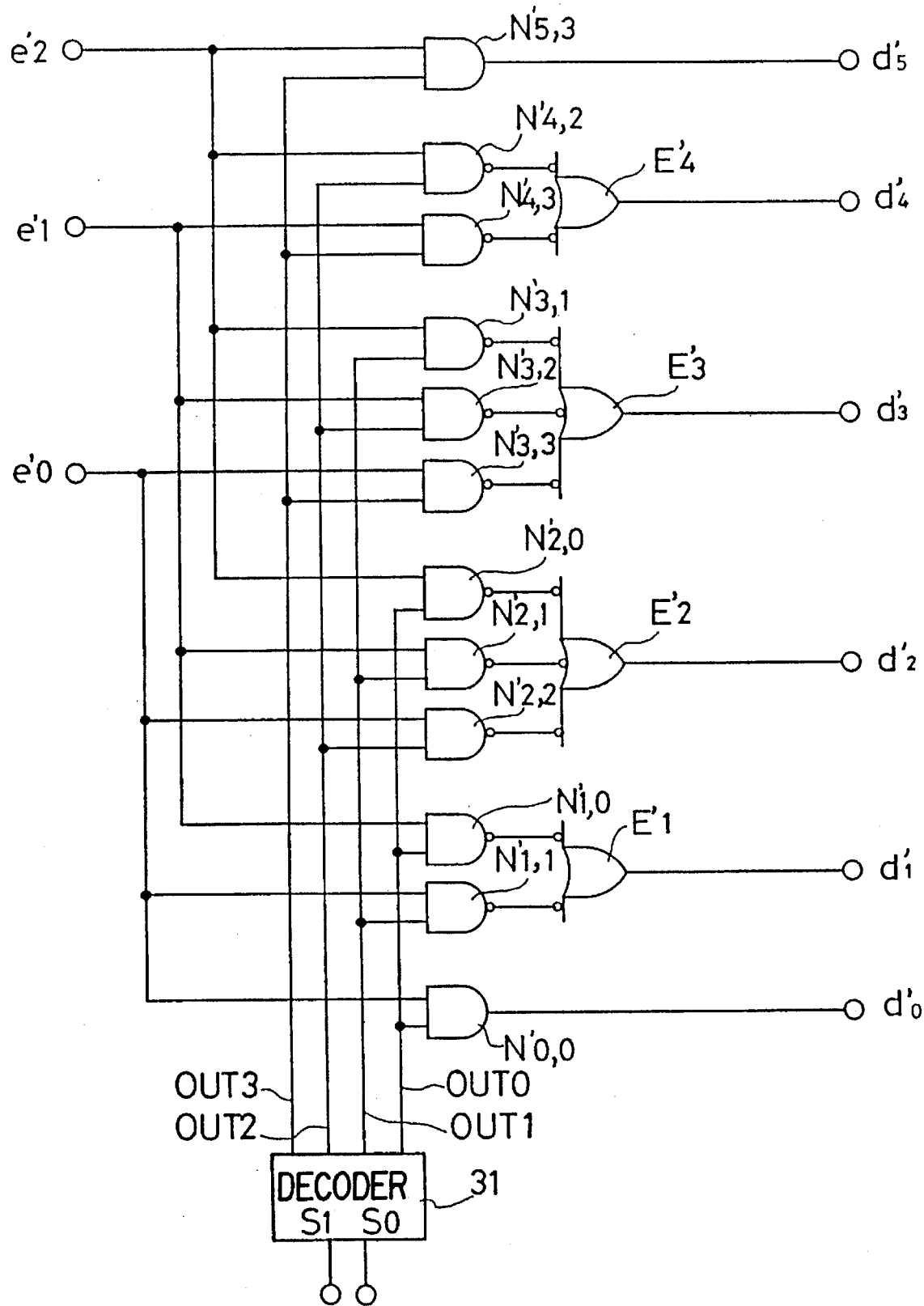
FIG. 3 is a circuit diagram showing a configuration of the embodiment shown in FIG. 1(b)

The circuit configurations and operation of the signal-compressing circuit 7 and of the signal-demodulating circuits 8 and 15 are next described in detail by referring to the circuit diagrams of FIGS. 2 and 3. First, the circuit configuration of the signal-compressing circuit 7 is described. In FIG. 2, a decoder 21 has terminals s0 and s1 to which a 2-bit digital signal corresponding to the amount of shift S is applied. A decoder output corresponding to the amount of shift S is produced from its output terminals out0–out3. For example, if the decoder receives a digital signal"11" indicating that the amount of shift is 3, then the output signal appearing at the output terminal out3 is 1. The output signals appearing at the other output terminals are 0s. Each of gates E0–E2 have four terminals. These gates have output terminals e0–e2, respectively, which in turn correspond to three lower bits, respectively, of the third digital signal. Indicated by Ni, j (i=0–2, j=0–3) are gates. The output gates N0, j-N2, j are connected with the inputs of the gates E0–E2, respectively. The output terminals outj of the decoder 21 are connected to one input terminal of respective gates Ni, j. The second digital signal is supplied to input terminals d0–d5. The input terminal d0 corresponds to the LSB, while the input terminal d5 corresponds to the MSB. The input terminal d0 is connected to the other input terminal of gate N0, 0. The input terminal d1 is connected with the other input terminals of gates N0,1 and N1,0. The input terminal d2 is connected to the other input terminals of gates N0,2, N1,1, and N2,0. The input terminal d3 is connected to the other input terminals of gates N0,3, N1,2, and N2,1. The input terminal d4 is connected to the other input terminals of gates N1,3 and N2,2. The input terminal d5 is connected with the other input terminal of gate N2,3.

The signal-compressing circuit 7 constructed as described thus far operates in the manner described now. For example, if the second digital signal is "001101", then "1", "0", "1", "1", "0", and "0" are applied to the input terminals d0–d5, respectively. If the amount of shift is "2" then "0" and "1" are applied to the input terminals s0 and s1, respectively, of the decoder 21. The output terminal OUT3 goes to 1. This enables the gates Ni,2. The states of the input terminals d2–d4 are produced to the output terminals e0–e2. In this way, "1", "1", and "0" are produced to the output terminals e0–e2, respectively. The third digital signal assumes the value "011".

The circuit configurations of the signal-demodulating circuits 8 and 15 are described now. In FIG. 3, there are shown gates N'0,0, N'1,0, N'1,1, N'2,0, N'2,1, N'2,2, N'3,1, N'3,2, N'3,3, N'4,2, N'4,3, and N'5,3. A decoder 31 is similar in construction and operation to the decoder 21. The decoder 31 has output terminals OUT$_p$ (p=0 to 3) connected with respective one-input terminals of gates N'o,p (o=0 to 5). Input terminals e'q (q=0 to 2) receive the third digital signal. The input terminal e'O corresponds to the LSB, while the input terminal e'2 corresponds to the MSB. The input terminal e'0 is connected with one input terminal of each of the gates N'0,0, N'1,1, N'2,2, and N'3,3. The input terminal e'1 is connected with one input terminal of each of the gates N'1,0, N'2,1, N'3,2, and N'4,3. The input terminal e'2 is connected with one input terminal of each of the gates N'2,0, N'3,1, N'4,2, and N'5,3. The gates N'0,0 and N'5,3 are connected with output terminals d'0 and d'5, respectively. The output terminals of the gates N'1, p-N'4,p are connected with the input terminals of the gates E'1–E'4, respectively. The output terminals of the gates E'1–E'4 are connected with the output terminals d'1–d'4, respectively. The fourth digital signal appears at these output terminals d'0–d'5. The output terminal d'0 corresponds to the LSB, whereas the output terminal d'5 corresponds to the MSB.

The signal-demodulating circuits 8 and 15 constructed in this way operate in the manner described now. If the third digital signal is "011" the "1", "1", and "0" are applied to the input terminals e'0–e'2, respectively. If the amount of shift is 2, the "0" and "1" are applied to the input terminals S0 and S1, respectively, of the decoder 31. The output terminal OUT2 assumes a value of 1, while the others take a value of 0. The gates N0,2 (0=2 to 4) are enabled. The states of the input terminals e'0–e'2 are delivered to the output terminal d'2–d'4, respectively. As a result, "1", "1", "0" and "0" are produced from the output terminals d'0–d'5, respectively. The fourth digital signal assumes value "001100".

Figure 4:
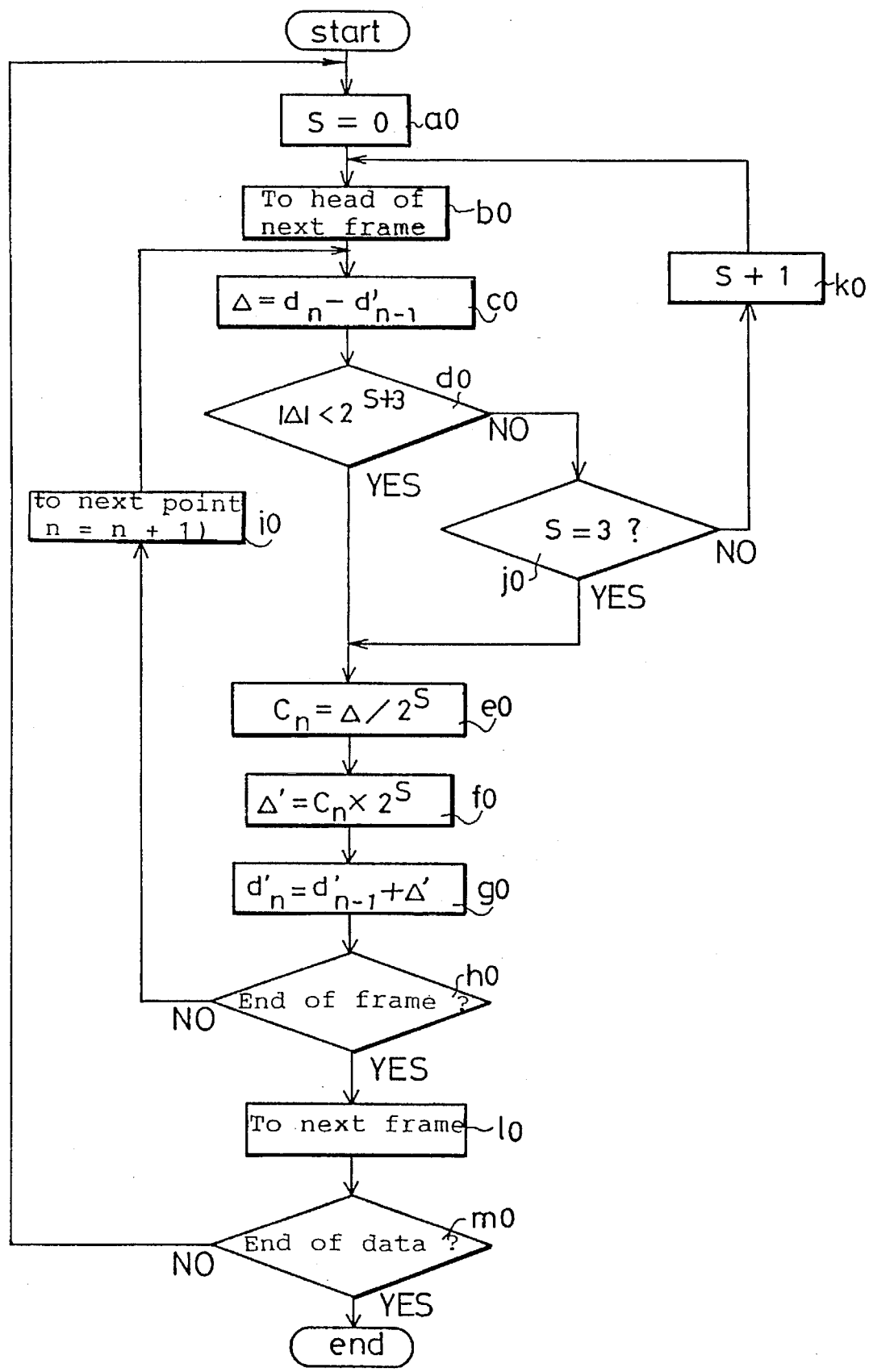
FIG. 4 is a flowchart describing the operation of the embodiment shown in FIG. 1(a)
Figure 5:
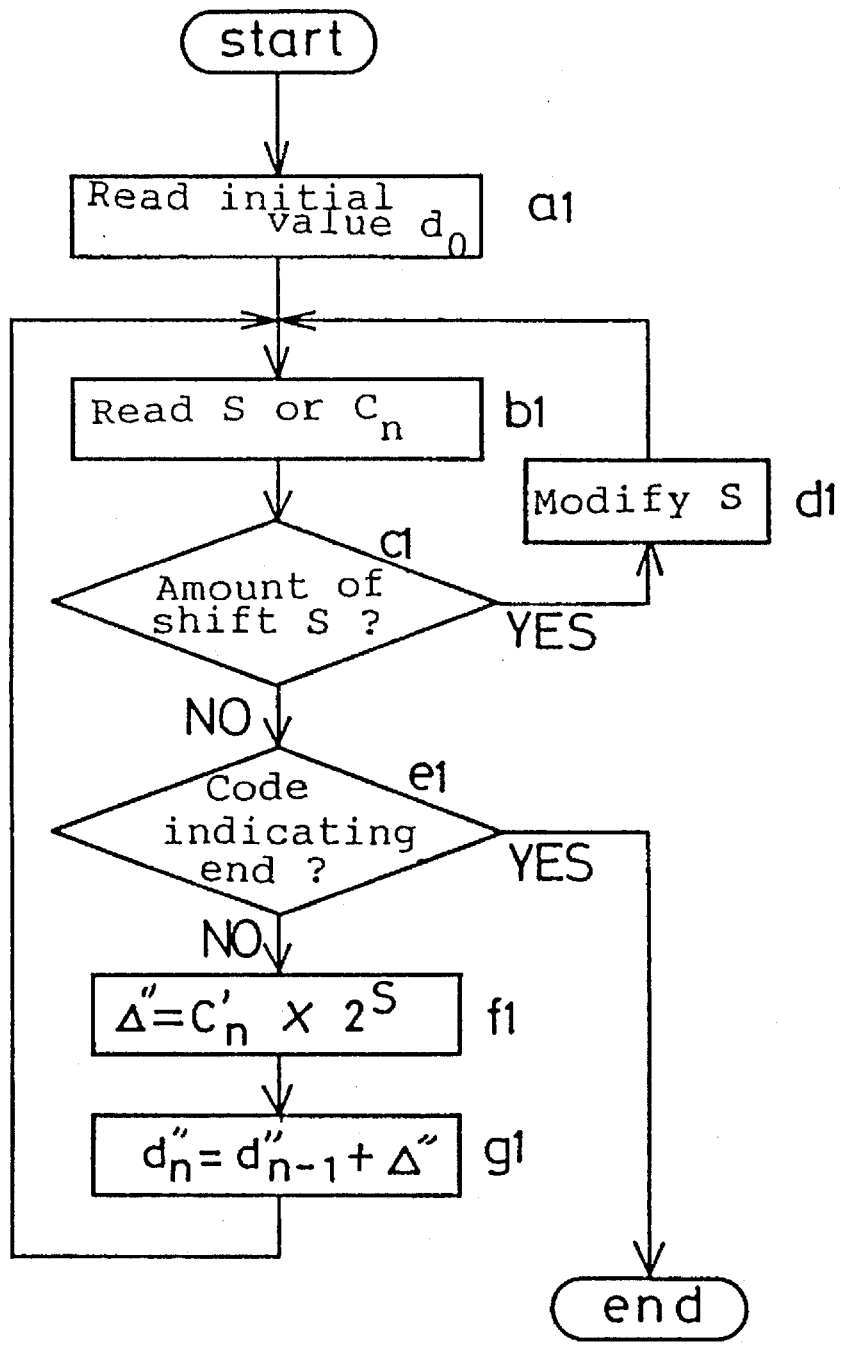
FIG. 5 is a flowchart describing the operation of the embodiment shown FIG. 1(b)

The operation of the present embodiment is described by referring to the block diagram of FIG. 1, the flowcharts of FIGS. 4 and 5, and the waveform diagrams of FIGS. 6 and 7. A, $\Delta$ C, and $\Delta'$ in FIG. 6 and C', $\Delta'$, and g in FIG. 7 indicate output waveforms appearing at the terminals shown in FIG. 1. Digital signals produced from the terminals $\Delta$, C, $\Delta'$, C, and $\Delta''$ are shown to correspond to analog values for the sake of convenience.

Figure 6A:
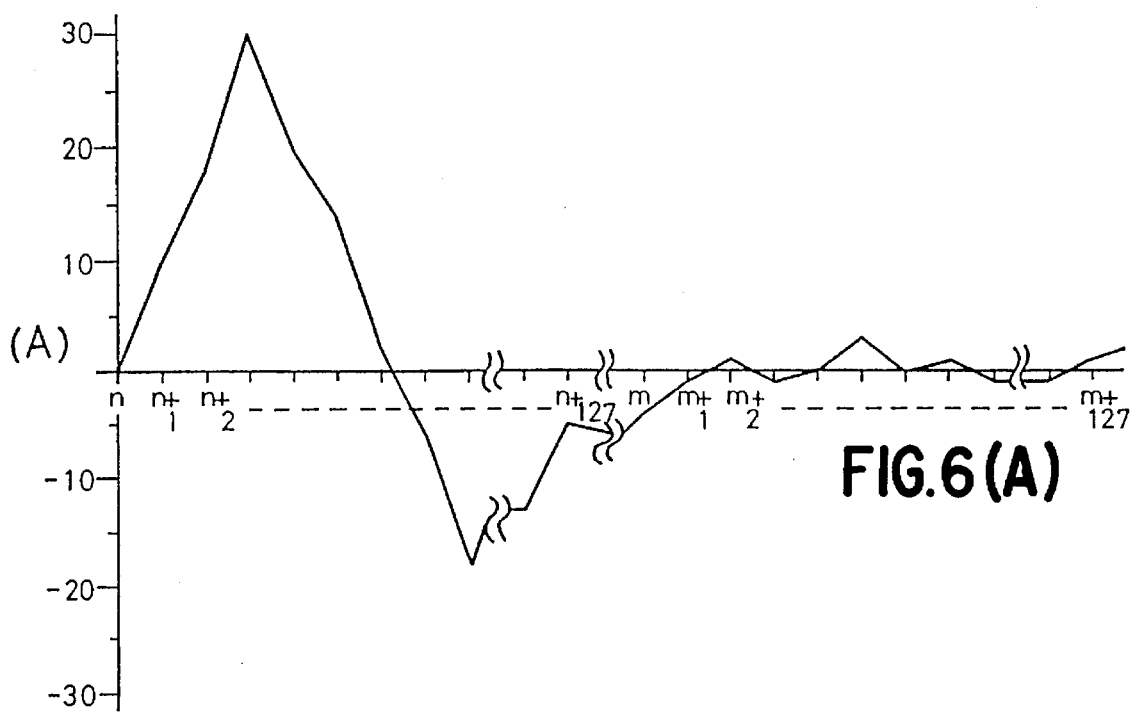
FIGS. 6(a)–6(d) are waveform diagrams used in describing the operation of the embodiment shown in FIG. 1(a)

An operation for recording a signal in the present embodiment is first described by referring to the flowchart of FIG. 4. The analog signal source i produces a waveform as shown FIG. 6(A). This waveform is sent to the sample-and-hold circuit 3 via the low-pass filter circuit 2. The sample-and-hold circuit 3 samples the amplitude value of the incoming waveform at a given sampling frequency. In FIG. 6(A), n, n+1, ..., m, m+1, ... show sampling points. The amplitude value produced from the sample-and-hold circuit 3 is converted into a digital signal by the A/D converter circuit 4 and sent to the buffer circuit 5. The buffer circuit 5 stores plural frames of the digital signal such that 128 samples of the digital signal are taken as one frame.

Figure 6B:
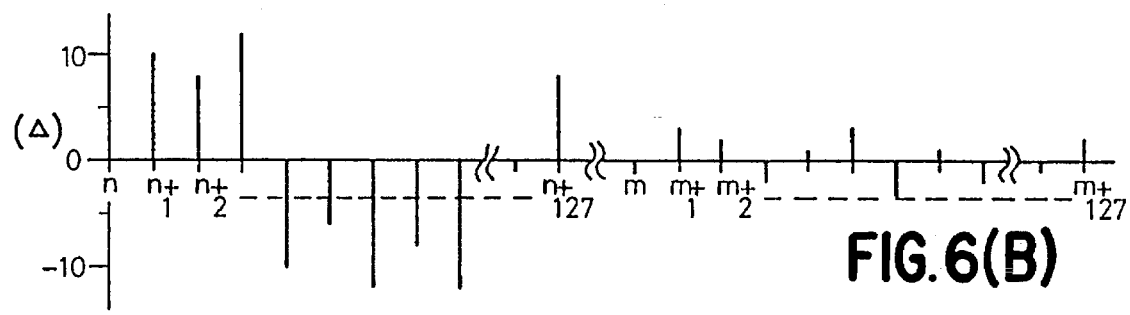
Figure 6C:
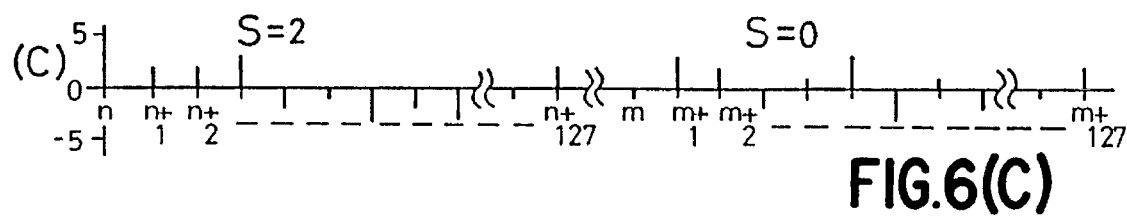
Figure 6D:
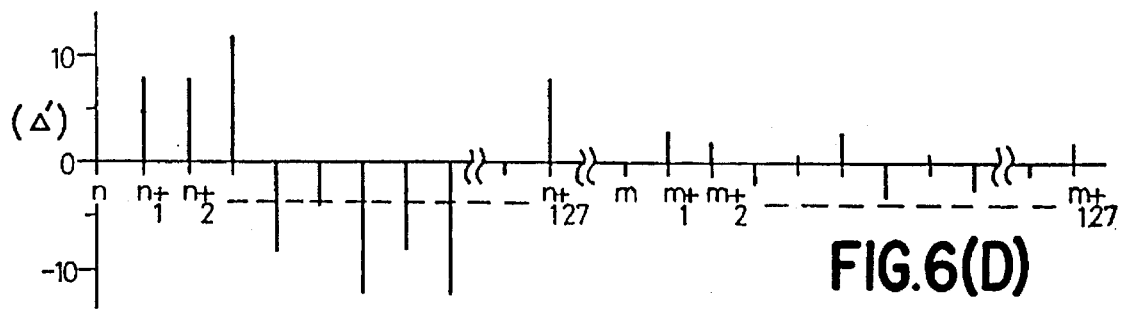

Then, the amount of shift S delivered from the setting circuit 11 is set to 0 (step a0). The amount of shift is stored in the shift amount storage region 12b in the memory 12 for the first frame. The digital signal stored in the buffer circuit 5 is successively read out from the head of the first frame in synchronism with synchronizing pulses of a desired frequency (step b0) and sent to the differential circuit 6. For example, the frequency of the pulses is the same as the sampling frequency. The differential circuit 6 takes the differences between the currently received digital signal dn (where n indicates that it corresponds to sampling point n) and an amplitude value signal d'n–1 corresponding to the previously received amplitude value and produces the obtained second digital signal $\Delta$ as an output signal (step c0), as shown in FIG. 6(b). The amplitude value signal d'n–1 does not exist for the first digital signal and so this digital signal is produced as the second digital signal $\Delta$ as it is. This second digital signal $\Delta$ is sent to the setting circuit 11, and a decision is made as to whether this value lies within a certain range. In this embodiment, a decision is made as to whether the value of the second digital signal $\Delta$ is within (3+S) bits (step d0). In particular, when the second digital signal $\Delta$ is converted into the third digital signal C shown in FIG. 6(c), a decision is made as to whether the value lies within 3 bits. If the value of the second digital signal is within this range, the second digital signal $\Delta$ is shifted toward lower bits by the signal-compressing circuit 7 in response to the amount of shift S delivered from the setting circuit 11. That is, the signal is compressed by a factor of K (K=$2^S$) and produced as the third digital signal Cn (step e0). Since the amount of shift is 0 here, it is produced as it is. This third digital signal Cn is stored in the compressed signal storage region 12a of the memory 12. The third digital signal Cn is also sent to the signal-demodulating circuit 8, where the signal is shifted toward upper bits according to the amount of shift S. That is, the signal is expanded by a factor of K, and converted into the fourth digital signal $\Delta'$ (step f0)

shown in FIG. 6(d). In other words, the signal is demodulated into a value corresponding to the second digital signal $\Delta$. The fourth digital signal $\Delta'$ is sent to the delay circuit 9, where the signal is delayed by one period of the aforementioned synchronizing pulses. Then, the delayed signal is supplied to the accumulator circuit 10. The accumulator circuit 10 accumulatively adds the fourth digital signal $\Delta'$ to the previously obtained value d'n–1 to obtain the amplitude value signal d'n corresponding to the present amplitude value (step g0). That is, the differences between the successive samples are accumulated to obtain the original amplitude values. The amplitude value signal d'n delivered from the accumulator circuit 10 is sent to the differential circuit 6.

Then, a decision is made as to whether it is the end of a frame (step h0). If it is not so, the operations described thus far are continued (step i0). The next first digital signal dn+1 is read from the buffer circuit 5. The differential circuit 6 takes the difference between this value and the amplitude value signal d'n corresponding to the amplitude value at sampling point n delivered from the accumulator circuit 10 to create the second digital signal $\Delta$ (step c0). Thereafter, a decision is made as to whether the value of the next second digital signal $\Delta$ lies within the range of (3+S) bits (step d0). That is, in step e0, the signal-compressing circuit 7 shifts the signal toward lower bits in response to the amount of shift S, and the signal is converted into the third digital signal Cn+1 of three bits. At this time, a decision is made as to whether an overflow occurs. If the difference in the amplitude value at sampling point n+1 is approximately "10" in decimal notation as shown in FIG. 6(A), the corresponding value of the second digital value is "001010". Therefore, the result of the decision is that the value does not lie in the certain range provided that the amount of shift is 0. In this case, a decision is made as to whether the amount of shift S exceeds the maximum value (step j0). In this example, a decision is made as to whether the amount of shift S is greater than 3. That is, in the present example, since 6 bits are compressed into 3 bits, the maximum value of the amount of shift is inevitably 3. Further shift is inhibited. If the result of, the decision is that the amount of shift S is not greater than 2, then the amount of shift produced by the setting circuit 11 is reset to S+1 (step k0).

The amount of shift reset in this way is sent to the shift amount storage region 12b of the memory 12, where the previous value is overwritten and updated. If the amount of shift S is updated, the digital signal is again read out from the head of each frame. The operations of steps b–k are repeatedly carried out for every digital signal about one frame. Whenever the amount of shift is updated, the third digital signal obtained at this time overwrites the previous value stored in the compressed signal storage region 12a, whereby the value is updated.

In this way, if none of the third digital signals within one frame cause an overflow, and if the amount of shift S is set to a value not greater than 3, then this amount of shift S is established as an amount of shift common to this frame. If none of these two requirements are satisfied within one frame (i.e., the condition imposed by the step d0 and the condition imposed by the step j0), then priority is given to the latter condition imposed by the step j0. That is, the amount of shift S is set according to the maximum value of the third digital signal $\Delta$ within one frame. Even if any third digital signal $\Delta$ causing an overflow with amount of shift assuming a value of 3 exists, then compression is performed with this amount of shift 3.

If the amount of shift S common to the first frame is determined in this way, the setting circuit 11 reads out the next frame (step 10). Then, a decision is made as to whether this frame is the end of all data stored in the buffer circuit 5 (step m0). If not so, reading of the digital signal from the head of the frame is started. The operations of steps b–m are repeated. The amount of shift is established for each frame and stored in the shift amount storage region 12b. The third digital signal obtained with this amount of shift is stored in the compressed signal storage region 12a. If the result of decision made in step m is that the frame is the end of all data, then this series of operations is ended. Thus, the operation for recording a signal in the present embodiment is ended.

As a result of the operations described above, the second digital signal Δ indicated by a in FIG. 6(B) is obtained from the analog signal shown in FIG. 6(A) at every sampling point. The second digital signal Δ is compressed by a factor of K (K=½$^S$) in response to the amount of shift S set for each frame. For example, the amount of shift is set to 2 for sampling points n to n+1 and to 0 for sampling points m to m+1. As a result, the signal is converted into the third digital signal C as shown in FIG. 6(C). The third digital signal C is stored in the memory 12 together with the amount of shift S for each frame.

As described thus far, in the present example, the waveform of an analog signal of one frame comprised of 128 samples can be expressed by the amount of shift S and by the third digital signal corresponding to the 128 samples, i.e., 2+(3×128) bits. In a normal DPCM method, the number of quantized bits is 5 bits and so the amount of information necessary to express the same analog signal corresponding to 128 samples is 5×128 bits. Therefore, in the present example, an analog signal having a wide dynamic range can be recorded with less amount of information. As indicated by Δ in FIG. 6(B), the values of the second digital signal Δ at the sampling points from m to m+1 are not greater than 3 bits. At this time, as shown in FIG. 6(C), the amount of shift is set to 0. The second digital signal Δ is taken as the third digital signal C without modifying the value of the second digital value. In this way, when the second digital value Δ is small, i.e., when a value corresponding to the difference between the amplitude values at successive sampling points is small, the amount of shift S is set to a small value. Hence, a truncation error produced when the second digital signal a is compressed by a factor of K and converted into the third digital signal C can be suppressed. For example, if the second digital signal is compressed by a factor of 4, two lower bits are truncated. This makes it possible to record an analog signal with great accuracy.

The amplitude value signal d' is obtained by accumulating the expanded third digital signal by a factor of K, i.e., the fourth digital signal Δ' up to the immediately previous sampling point. The difference between this amplitude value signal d' and the present first digital signal is used as the second digital signal Δ. Therefore, the value truncated when the second digital signal Δ is compressed by a factor of K and converted into the third digital signal C is contained in the second digital signal Δ and canceled out when the second digital signal Δ is obtained. Consequently, during reproduction described later, errors due to truncated values are prevented from being accumulated.

Figure 8A:
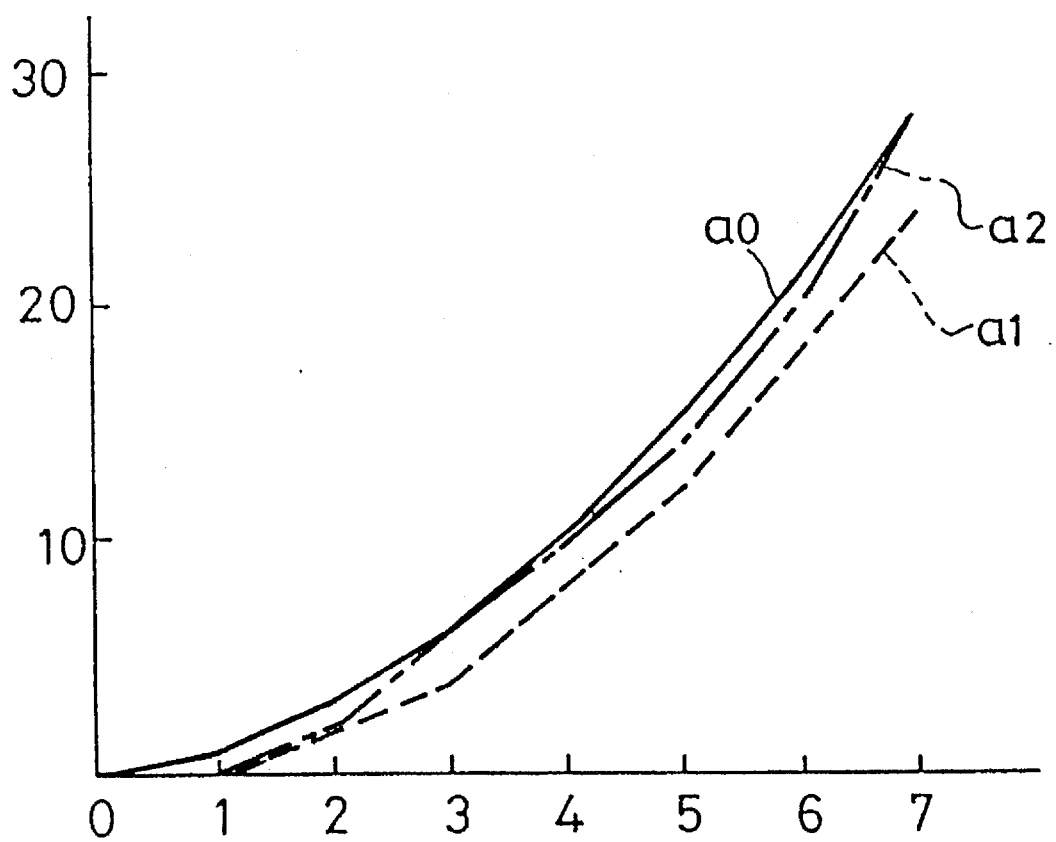
Figure 8B:
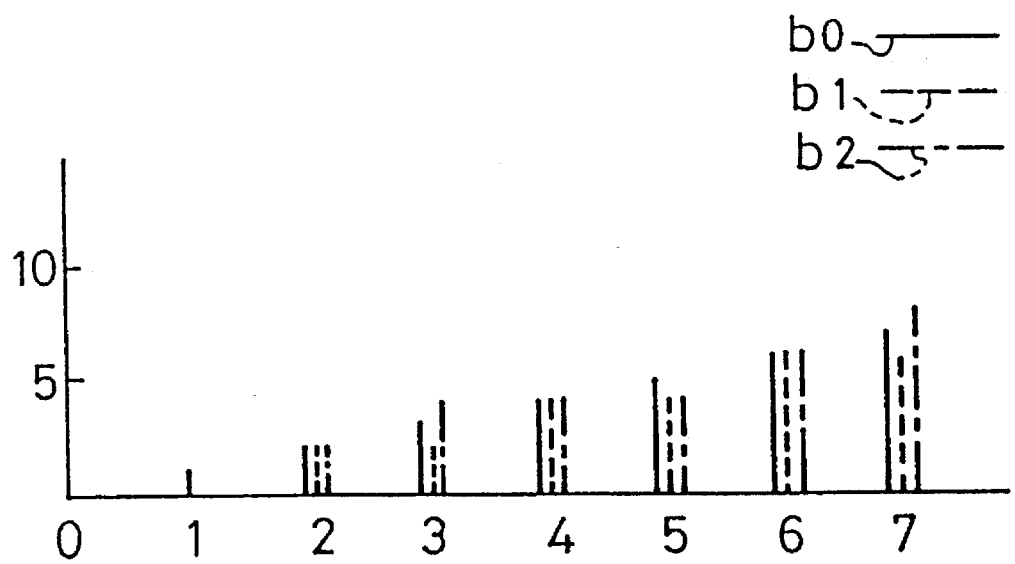
Figure 9A:
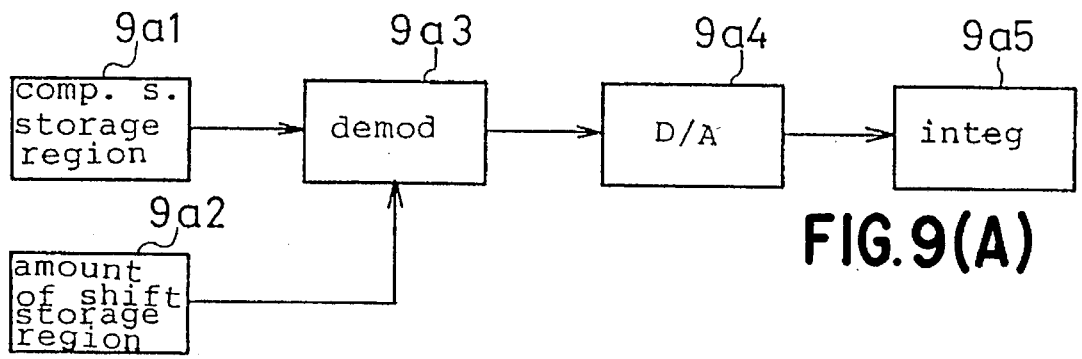
FIGS. 9(a)–9(d) are block diagrams showing other embodiments of the present invention, respectively.

Reference is made to the waveform indicated by the solid line a0 in FIG. 9(a) as an example. The differences between the successive amplitude values at sampling points 0–7 are indicated by the solid line b0 in FIG. 8(b). It is assumed that the difference value increases by 1 at every next sampling point. At waveform a0, a simple difference between the amplitude value at one sampling point and the amplitude value at the immediately previous sampling point is taken. The lowermost 1 bit (corresponding to values incapable of being divided by 2) of the resulting difference signal is truncated, so that the signal is compressed by a factor 2. In this way, a compressed signal is obtained. During reproduction, difference value b1 obtained by expanding the compressed signal by a factor of 2 is accumulated. In this manner, a waveform as indicated by the broken line a1 is derived. However, truncation errors produced during compression are accumulated at the same time. For this reason, the deviation of the waveform a1 from the original waveform a0 gradually increases. On the other hand, the fourth digital signal obtained by expanding the third digital signal which is obtained from the waveform indicated by the solid line a0 assumes the form indicated by the dot-and-dash line b2 in FIG. 8(b). A waveform obtained by accumulating this signal takes the form indicated by the don-and-dash line a2. In consequence, the deviation of the waveform a2 from the original waveform a0 is suppressed.

An operation for reproducing a signal in the present embodiment is described now by referring to the flowchart of FIG. 5. As described above, the memory 12 shown in FIG. 1(b) has the shift amount storage region 12b for a certain frame and the compressed signal storage region 12a, the regions 12a and 12b having alternating addresses. Values of the third digital signals obtained from the certain frame are successively stored in the compressed signal storage region 12a. The values of the amount of shift S and the values of the third digital signal recorded by the signal recording operation described above are stored in these regions. A given initial value d0 is stored at an address immediately preceding the address of the first shift amount storage region 12b of the memory 12. The initial digital signal which is obtained by sampling an analog signal so as to convert it into digital form and storing the signal in the buffer circuit 5 is directly used as the initial value d0.

First, the selecting circuit 14 and the latch circuit 17 are reset. The address counter circuit 13 received synchronizing pulses f of a desired frequency (e.g., equal to the sampling frequency) and starts reading from the memory 12 in synchronism with the leading edge of any one of the pulses. First, the initial value d0 is read out (step a1) and sent to the signal-demodulating circuit 15. This demodulating circuit 15 which is informed that the amount of shift is 0 by the selecting circuit 14 sends the initial value d0 to the adder circuit 16 without modifying the initial value. The adder circuit 16 produces the sum of the initial value d0 and the output from the latch circuit and sends the sum to the latch circuit 17. The latch circuit 16 latches the initial value d0 in response to the trailing edge of any one of the synchronizing pulses.

Then, a signal following the initial value d0 is read from the memory 12 (step b1). In this example, the amount of shift S about the initial frame is read out. The signal read from the memory 12 is also furnished to the selecting circuit 14, where a decision is made as to whether the signal is the amount of shift S or the third digital signal (step c1). If the signal is the amount of shift S, this amount is held and produced to the signal-demodulating circuit 15 so as to modify the amount of shift S (step d1). In this embodiment, the amount of shift about the first frame is 2 as mentioned previously. If this amount is delivered from the memory 12, this amount is held and sent to the signal-demodulating circuit 15. In this way, the demodulating circuit 15 produces a signal which is obtained by expanding the incoming third digital signal by a factor of K (K=$2^S$=$2^2$=4), i.e., shifting the signal toward upper bits by 2 bits.

Subsequently to the amount of shift S, the third digital signal C'n at the head of the frame is read out. In this embodiment, the amount of shift is not modified (step c1). The signal is not at the end of the data stored in the memory 12 (step e1). The signal-demodulating circuit 15 receiving the third digital signal C'n shifts it toward upper bits in response to the amount of shift S (2 in this embodiment) and converts the signal into the fifth digital signal Δ" corresponding to the difference between sampled amplitude values (step f1). This fifth digital signal Δ" is delivered to the adder circuit 16, where the fifth digital signal is added to the contents (d0 in this example) of the latch circuit 17. The resulting signal is sent to the latch circuit 17 (step g1). The latch circuit 17 latches the signal in response to the leading edge of the synchronizing pulse f applied to it immediately thereafter and produces the signal as the digital signal d"n. The next third digital signal C'n+1 is read from the memory 12 and converted into the fifth digital signal Δ' in response to the amount of shift (=2) by the signal-demodulating circuit 15, in the same way as the foregoing. This fifth digital signal is added to the output from the latch circuit 17 by the adder circuit 16. The output signal from the adder circuit 16 is sent to the latch circuit 17. The latch circuit 17 latches the signal and produces it as the digital signal d"n+1.

Figure 7A:
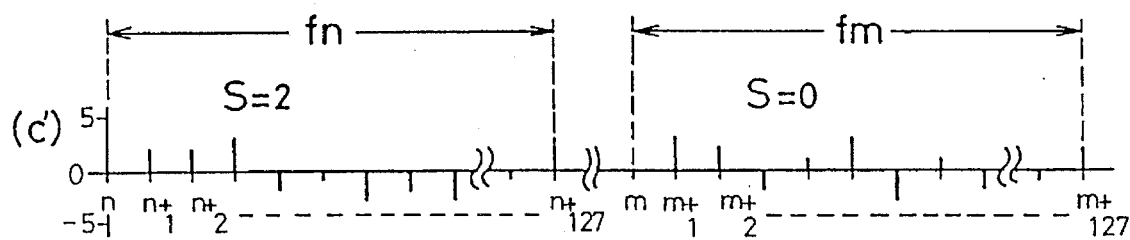
FIGS. 7(a)–7(c), 8(a) and 8(b) are waveform diagrams used in describing the operation of the embodiment shown in FIG. 1(b)
Figure 7B:
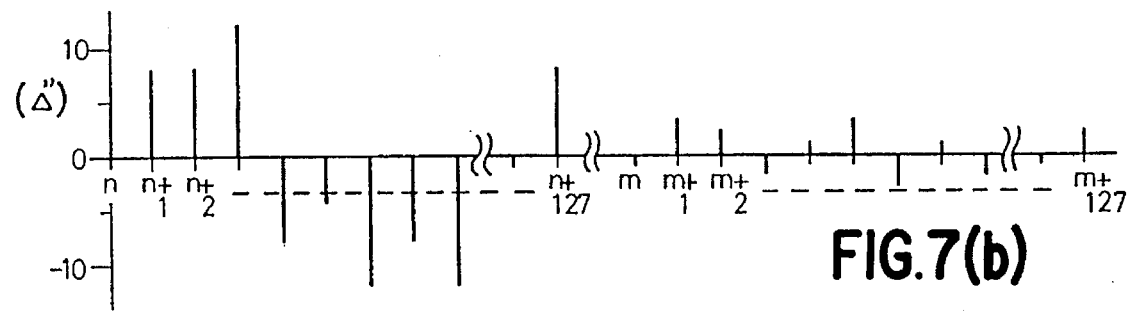
Figure 7C:
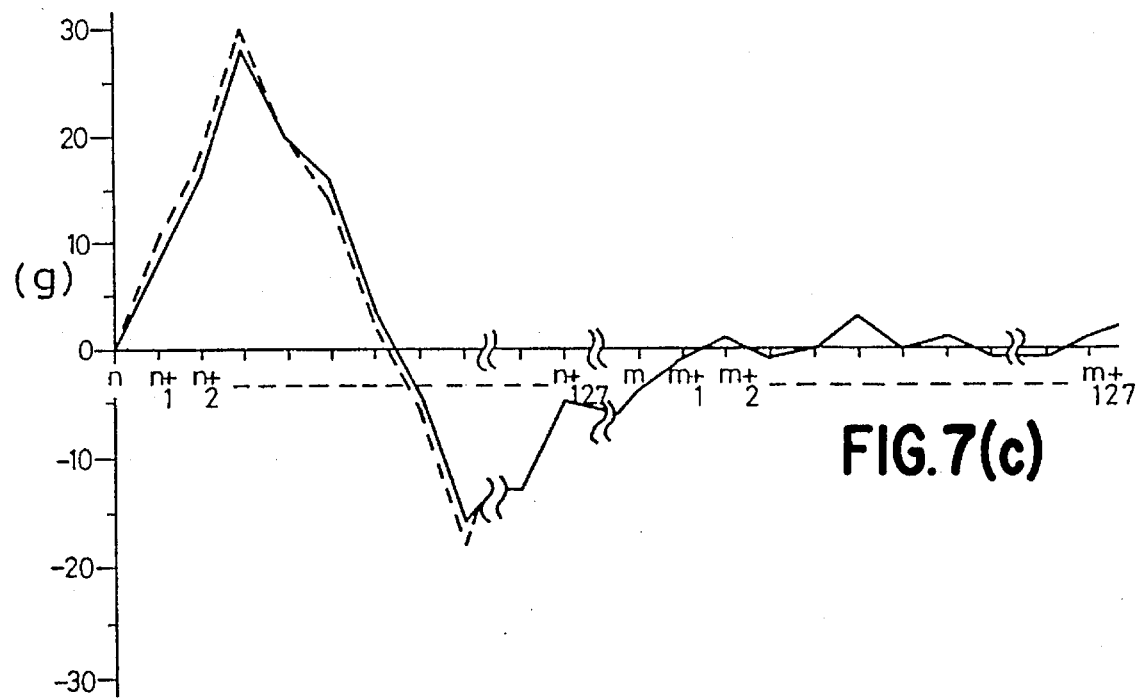

The operations of the steps b1–g1 are repeated effected to successively read the third digital signal C' about the first frame as indicated by C' in FIG. 7(a). These values are shifted in response to the amount of shift (=2). In this way, the third digital signal is converted into the fifth digital signal Δ" corresponding to the differences between the successive amplitude values as indicated by Δ" in FIG. 7(b). These values of the fifth digital signal Δ" are accumulated by the adder circuit 16 and by the latch circuit 17. Thus, the fifth digital signal is converted into a digital signal corresponding to the amplitude values at various sampling points. The converted signal is produced from the latch circuit 17.

The operations of the steps b1–g1 described above are repeatedly carried out. The following frames are read out. Each time the amount of shift S stored in the head of a frame is read out, the amount of shift stored in the selecting circuit 14 is updated in response to the amount of shift read out. For example, with respect to the second frame fm, the amount of shift is updated to 0. In this case, the amount of shift is 0 and so each third digital signal is produced as each fifth digital signal without being modified. The values of the fifth digital signal are accumulated in the latch circuit 17 and successively delivered. As a result, a digital signal corresponding to the amplitude value at each sampling point is obtained.

In this way, the frames are read out successively. During this operation, the digital signal produced from the latch circuit 17 is converted into analog form by the D/A converter circuit 18 to reproduce the analog signal as indicated by the solid line g in FIG. 7(c). The original analog signal is indicated by the broken line.

As described above, in the present embodiment, amplitude values of an analog waveform are sampled. A given number of samples are treated as one frame. The difference value between successive samples in sampled for each frame. The amount of shift S common to one frame is established according to these difference values, or the second digital signal. The second digital signal is shifted toward lower bits in response to the amount of shift. As a result, the second digital signal is compressed into the third digital signal consisting of a lesser number of bits than the second digital signal. This amount of shift S is so established that when the difference values are small, the amount of shift is reduced to suppress errors produced during compression. When the difference values are large, the amount of shift is increased so that a large dynamic range is obtained. Therefore, it is possible to cope with great signal variations without neglecting small variations in the analog signal. Since the amount of shift S common to one frame is established, it is not necessary to record each individual amount of shift S together with the third digital signal when this third digital signal is recorded. The signal can be recorded with a small amount of information. In this way, in the present embodiment, an analog signal having a wide dynamic range can be accurately recorded and reproduced with a small amount of information.

In the above embodiment, values of the digital signal indicating the amount of shift S about one frame and all the values of the third digital signal for the same frame are alternately stored in the memory 12. The present invention is not limited to this method. Buffers may be provided for these two kinds of information, respectively, and these two kinds of information may be stored in these buffers, respectively. The two kinds of information may be read out separately by their respective reading means. In a further modified embodiment, during recording of a signal, the two kinds of information are once stored in separate buffers. After the analog signal is fully recorded, a digital signal indicating the amount of shift S about one frame and the whole third digital signal for the same frame may be alternately stored in one memory. In a still further modified embodiment, values of a digital signal indicating the amount of shift S are stored at regularly spaced memory locations. During reading, the signal is not stored in the selecting circuit 14 at regular intervals of time. A digital signal indicating changes in the amount of shift S is created in response to the frames having different amounts of shift S. A digital signal indicating the amount of shift S is stored at addresses located immediately after the addresses at which the digital signal is stored in the memory. Whenever the digital signal indicating the amount of shift S is read out, this digital signal is stored in the selecting circuit 14.

It is to be noted that the present invention is not limited to the above embodiment. For example, a signal can be reproduced by the structure shown in FIG. 9(A). This comprises a compressed signal storage region 9a1, a shift amount storage region 9a2, and a signal-demodulating circuit 9a3 which are similar to their counterparts of the above embodiment. In addition, the structure has a D/A converter circuit 9a4 receiving the fifth digital signal from the signal-demodulating circuit 9a3 and integrating circuit 9a5 receiving the output from the D/A converter circuit 9a4. In the above example, values of the fourth digital signal corresponding to the difference between successive amplitude values are summed up. A digital signal corresponding to the amplitude values is produced and converted into analog form. In the preset embodiment, the fifth digital signal corresponding to the differences between successive amplitude values is converted into an analog signal, which is in turn integrated by the integrating circuit 9a5. In this way, the original analog signal is reproduced. This embodiment yields advantages similar to the advantages obtained by the above embodiment.

Figure 9B:
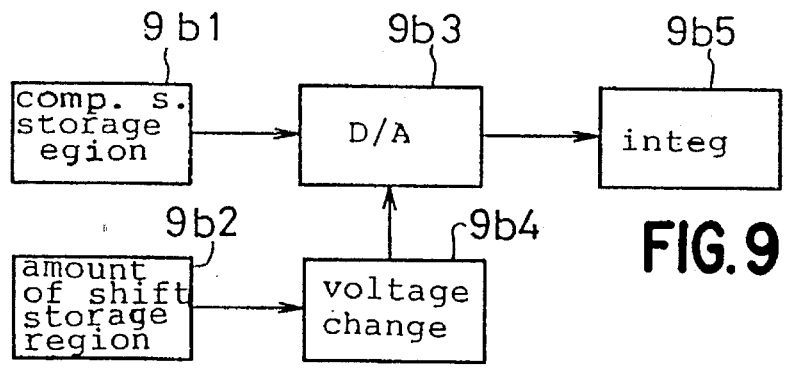

A signal can also be reproduced by the structure shown in FIG. 9(B). This structure has a compressed signal storage region 9b1 and a shift amount storage region 9b2 which are similar in structure to their counterparts of the above embodiment. In addition, the structure has a D/A converter circuit 9b3 for converting the third digital signal read from the compressed signal storage region 9b1, a reference voltage change circuit 9b4 for modifying the reference voltage of the D/A converter circuit 9b3 according to the amount of shift produced from the shift amount storage region 9b2, and an integrator circuit 9b5 receiving the output from the D/A converter circuit 9b3. In this case, when the third digital signal is converted into analog form, the reference voltage of the D/A converter circuit is varied according to the amount of shift. As a result, an output signal which would normally be obtained when a shift is made is created. An analog signal corresponding to the differences between the successive amplitude values produced from the D/A converter circuit is integrated by the integrating circuit 9b5. In consequence, the original analog signal is reproduced. This structure also yields advantages similar to the advantages obtained by the above embodiment.

Figure 9C:
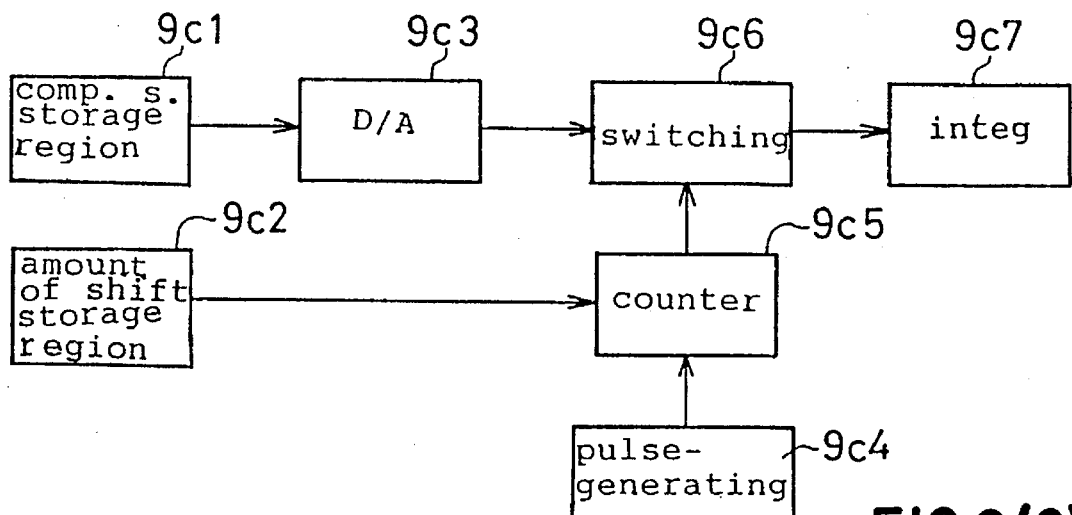
Figure 10A:
FIGS. 10(a)–10(d) are timing charts used in describing the operation of the embodiment shown in FIG. 9(c)
Figure 10B:
Figure 10C:
Figure 10D:
Figure 11:
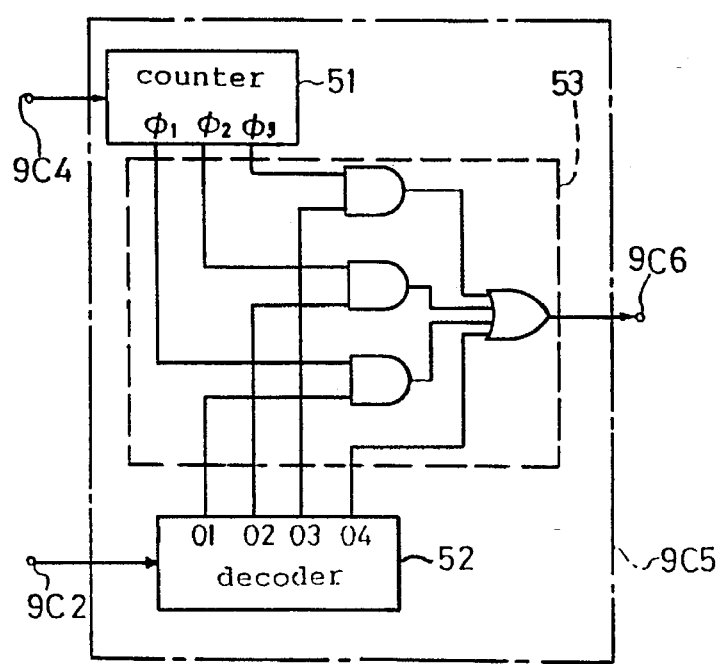
FIG. 11 is a circuit diagram showing the configuration of the counter in the embodiment of FIG. 9(c).

Also, it is possible to reproduce a signal by the structure shown in FIG. 9(C). This embodiment has a compressed signal storage region 9c1 and a shift amount storage region 9c2 which are similar to their counterparts of the above embodiment. In addition, the structure has a D/A converter circuit 9c3 for converting the third digital signal read from the compressed signal storage region 9c1 into analog form, a counter circuit 9c5 for counting clock pulses produced from a pulse signal-generating circuit 9c4 up to a value corresponding to the amount of shift delivered from the shift amount storage region 9c2, a switching circuit 9c6 for transmitting the output from the D/A converter circuit 9c3 while receiving the pulses from the counter circuit 9c5, and an integrating circuit 9c7 for integrating the output supplied to the integrator circuit from the D/A converter circuit 9c3 via the switching circuit 9c6. As shown in FIG. 11, the counter circuit 9c5 comprises a counter portion 51 for receiving clock pulses OSC (FIG. 10(a)) produced from the pulse-generating circuit 9c4 as shown in FIG. 11 and for producing pulses $\Phi_1$, $\Phi_2$, and $\Phi_3$ having different pulse widths as shown in FIGS. 10(b)–10(d), a decoder portion 52 for decoding the amount of shift produced from the shift amount storage region 9c2, and a selecting portion 53 for selectively delivering the pulses $\Phi_1$, $\Phi_2$, and $\Phi_3$ produced from the counter portion 51 according to the output from the decoder portion 52. In this case, the third digital signal is converted into an analog signal. The timing during which this analog signal is sent to the integrating circuit 9c7 is controlled by the switching circuit 9c6. In this way, a weight corresponding to the amount of shift is given to the analog value produced to the integrating circuit 9c7. This embodiment also produced advantages similar to the advantages obtained by the above embodiment.

Figure 9D:
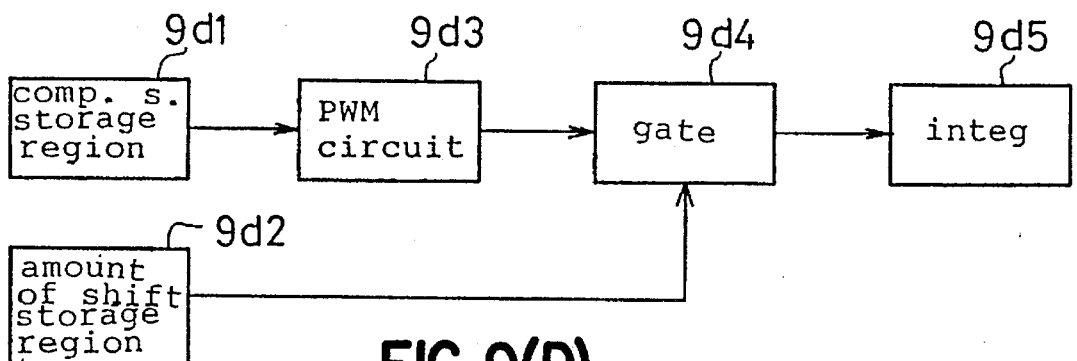

Furthermore, it is possible to reproduce a signal by the structure shown in FIG. 9(D). This embodiment has a compressed signal storage region 9d1 and a shift amount storage region 9d2 which are similar in structure to their counterparts of the above embodiments. In addition, this embodiment has a PWM (pulse width modulation) circuit 9d3 for producing pulses responsive to the third digital signal read from the compressed signal storage region 9d1, a gate 9d4 which is enabled according to the amount of shift read from the shift amount storage region 9d2 and which transmits the output from the PWM circuit 9d3, and an integrating circuit 9d5 receiving the output from the gate 9d4. In this case, the third digital signal is modified into a pulse having a pulse width corresponding to the value of the third digital signal. A weight corresponding to the amount of shift is given by the gate 9d4. Then, the signal is integrated by the integrating circuit 9d5. In this way, the original signal is reproduced. This embodiment also produces advantages similar to the advantages obtained by the above embodiments.

The second digital signal corresponds to the differences between successive amplitude values at successive sampling points. Furthermore, an analog signal may be sampled and held and then converted into a digital value. This digital value may be delayed by one sampling period. The difference between this delayed value and the value obtained by currently converting the analog signal into digital form may also be used as the second digital signal. Moreover, an analog signal may be sampled and held and then delayed by one sampling period. The difference between this delayed value and the value obtained by currently sampling and holding the analog signal is taken and converted into a digital value. This digital value may be used as the second digital signal. In these cases, the second digital signal is stored in a buffer or the like. Also, in these cases, a frame is provided for every certain number of samples. An amount of shift is established for each frame. The signal is converted into the third digital signal in response to the amount of shift.

The method of compressing the second digital signal by a factor of K is not limited to the method of shifting the bits by means of the signal-compressing circuit 7. The division may also be performed by the use of a division circuit (not shown) instead of the signal-compressing circuit 7. Similarly, in order to expand the third digital signal by a factor of K, a multiplication circuit (not shown) may be used to perform the multiplication instead of the signal-demodulating circuit 8 or 15.

According to the present invention, an analog signal having a wide dynamic range can be recorded and reproduced at high accuracy with a small amount of information.

What is claimed is:

1. A method of recording a signal comprising the steps of:

sampling an analog signal at a given sampling frequency to produce a sampled signal;

converting the sampled signal into digital form to create a first digital signal;

storing the first digital signal in a first storage region whenever a predetermined number of samples are produced;

successively reading the first digital signal from said storage region;

taking a difference between an amplitude signal corresponding to an amplitude of a presently read first digital signal and an amplitude signal corresponding to an amplitude of a previously read first digital signal, to produce a second digital signal;

converting the second digital signal into a third digital signal which is equal essentially to 1/K of the second digital signal;

setting a value of K for each third digital signal obtained from the first digital signals stored in said first storage region, such that the values of the third digital signal lie in a predetermined range; and storing said third digital signals and data representative of said values of K.

2. A method according to claim 1, wherein said step of converting the second digital signal into a third digital signal is obtained by the step of shifting said second digital signal toward lower bits thereof by S digits, wherein $K=2^S$, where S is an integer within a predetermined range.

3. A method according to claim 2, wherein S is in the range of 0 to 3 inclusive.

4. A method according to claim 2, wherein said amplitude signal corresponding to the amplitude of the previously read first digital signal is obtained by shifting the third digital signal toward upper bits by S bits so as to create a fourth digital signal and accumulating a plurality of said fourth digital signals.

5. A method according to claim 2, wherein the value of S is reduced when the value of said second digital signal is reduced.

6. A method according to claim 2, wherein the values of said third digital signal are integers.

7. A method according to claim 1, wherein said step of converting the second digital signal into a third digital signal includes the step of dividing the value of said second digital signal by a factor 1/K where K is an integer to produce a divided result, and truncating said divided result to produce said third digital signal.

8. A method of recording/reproducing a signal, comprising the steps of:

producing a recording signal by the steps of:
sampling an analog signal at a given sampling frequency to produce a sampled signal;
converting the sampled signal into digital form to create a first digital signal;
storing the first digital signal in a first storage region whenever a predetermined number of samples are produced;
successively reading the first digital signal from said storage region;
taking a difference between an amplitude signal corresponding to an amplitude of a presently read first digital signal and an amplitude signal corresponding to an amplitude of a previously read first digital signal, to produce a second digital signal;
converting the second digital signal into a third digital signal which is equal essentially to 1/K of the second digital signal;
setting a value of K for each third digital signal obtained from the first digital signals stored in said first storage region, such that values of the third digital signal lie in a predetermined range; and
storing said third digital signals and data representative of said values of K; and producing a reproduction signal by the steps of:
reading out the third digital signals and the data representative of values of said K;
multiplying the third digital signal by K to convert the third digital signal into a fourth digital signal; and
producing an accumulated signal as an analog output signal by successively accumulating one of:
said fourth digital signal, and
an analog equivalent signal obtained by convening the fourth digital signal into an analog form.

9. A method according to claim 8, wherein said step of converting the second digital signal into a third digital signal is obtained by the step of shifting said second digital signal toward lower bits thereof by S digits, wherein $K=2^S$, where S is an integer within a predetermined range.

10. A method according to claim 9, wherein S is in the range of 0 to 3 inclusive.

11. A method according to claim 9, wherein said amplitude signal corresponding to the amplitude of the previously read first digital signal is obtained by shifting the third digital signal toward upper bits by S bits so as to create a fourth digital signal and accumulating a plurality of said fourth digital signals.

12. A method according to claim 9, wherein the value of S is reduced when the value of said second digital signal is reduced.

13. A method according to claim 9, wherein the values of said third digital signal are integers.

14. A method according to claim 8, wherein said step of converting the second digital signal into a third digital signal includes the step of dividing the value of said second digital signal by a factor 1/K where K is an integer to produce a divided result, and truncating said divided result to produce said third digital signal.

15. A method according to claim 8, wherein said step of multiplying includes the step of shifting said third digital signal toward upper bits thereof by S digits wherein $K=2^S$.

16. A method according to claim 8, wherein said step of multiplying includes the steps of converting said third digital signal to an analog signal by a digital-to-analog converter having an input supplied with a reference voltage, and modifying said reference voltage in accordance with said value K.

17. A method according to claim 8, wherein said step of multiplying includes the steps of:
converting said third digital signal to an analog signal,
counting a value up to an amount of shift S, where $K=2^S$, and
switching said analog signal through a switching means at a time dependent on said counted value.

18. A method according to claim 8, wherein said step of multiplying includes the steps
converting said third digital signal to a pulse width modulated signal, and
gating said pulse width modulated signal through gating means in accordance with said value K.

19. A method according to claim 8, wherein said step of producing an accumulated signal includes the step of integrating one of:
said fourth digital signal, and
an analog equivalent signal obtained by converting the fourth digital signal into an analog form.

* * * * *